United States Patent
Gillmann et al.

(10) Patent No.: US 8,492,670 B2
(45) Date of Patent: Jul. 23, 2013

(54) ROCKER SWITCH

(75) Inventors: Uwe Gillmann, Berlin (DE); Rainer Maurer, Berlin (DE); Michael Stoffers, Berlin (DE)

(73) Assignee: CoActive Technologies, Inc., Newton, MA (US)

( * ) Notice: Subject to any disclaimer, the term of this patent is extended or adjusted under 35 U.S.C. 154(b) by 238 days.

(21) Appl. No.: 13/054,441

(22) PCT Filed: Jul. 14, 2009

(86) PCT No.: PCT/EP2009/005108
§ 371 (c)(1),
(2), (4) Date: Jan. 14, 2011

(87) PCT Pub. No.: WO2010/006762
PCT Pub. Date: Jan. 21, 2010

(65) Prior Publication Data
US 2011/0114465 A1      May 19, 2011

(30) Foreign Application Priority Data

Jul. 15, 2008   (DE) .......................... 10 2008 033 738

(51) Int. Cl.
*H01H 21/24*   (2006.01)

(52) U.S. Cl.
USPC ........................................................ 200/557

(58) Field of Classification Search
USPC ......... 200/329, 336, 339, 529, 538, 557–559, 200/553, 401, 409, 457, 459
See application file for complete search history.

(56) References Cited

U.S. PATENT DOCUMENTS

| | | | | |
|---|---|---|---|---|
| 3,576,959 | A | * | 5/1971 | Bogosoff ..................... 200/84 C |
| 3,958,595 | A | * | 5/1976 | Al et al. ........................ 137/375 |
| 4,442,328 | A | | 4/1984 | Schaffeler |
| 4,459,578 | A | * | 7/1984 | Sava et al. ..................... 338/128 |
| 5,510,583 | A | * | 4/1996 | Pescetto ........................ 200/1 B |
| 5,690,395 | A | * | 11/1997 | Hicks .......................... 301/105.1 |
| 5,861,796 | A | * | 1/1999 | Benshoff ..................... 338/32 H |
| 6,329,621 | B1 | * | 12/2001 | Priesemuth ................... 200/537 |
| 6,566,619 | B2 | * | 5/2003 | Gillman et al. .............. 200/339 |
| 7,273,983 | B1 | * | 9/2007 | Rintz .............................. 174/66 |
| 2003/0234163 | A1 | | 12/2003 | Ichida et al. |

FOREIGN PATENT DOCUMENTS

| | | |
|---|---|---|
| AT | 1590524 | 5/1966 |
| DE | 3126816 A1 | 1/1983 |
| DE | 3527184 C1 | 7/1985 |
| DE | 10144988 C1 | 10/2002 |
| DE | 10117597 C1 | 11/2002 |

(Continued)

*Primary Examiner* — Edwin A. Leon
*Assistant Examiner* — Anthony R Jimenez
(74) *Attorney, Agent, or Firm* — Pepper Hamilton LLP

(57) ABSTRACT

A rocker switch including a switching unit made up of a housing and including a spring-action switching element that moves back and forth with an actuating rocker that is connected to the switching element, whereby the switching element has a rotating axle rotatably supported within the housing and is surrounded by a spring. The spring is double wound and held in a prestressed state within the housing, one of the spring end shanks of the spring being fixedly supported within the housing, the other spring end shank being supported on a first arm that is connected in a rotationally fixed manner to the rotating axle, and an extended central spring leg being both fixedly supported within the housing as well as being supported on a second arm that is connected in a rotationally fixed manner to the rotating axle, and with an electrical switching unit.

14 Claims, 3 Drawing Sheets

FOREIGN PATENT DOCUMENTS

| | | |
|---|---|---|
| DE | 202006008333 U1 | 8/2006 |
| FR | 698317 A | 1/1931 |
| WO | 2007116132 A1 | 10/2007 |
| WO | WO 2007116132 A1 * | 10/2007 |

* cited by examiner

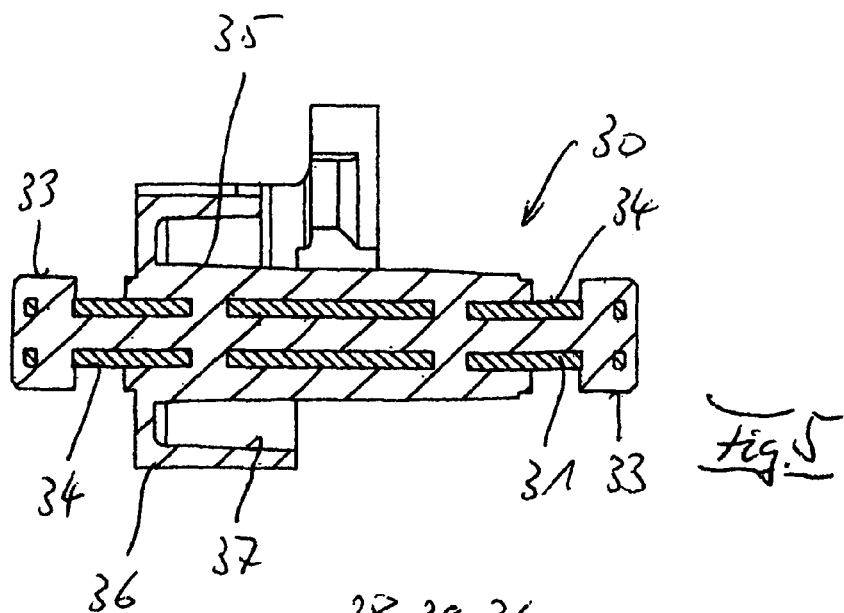
fig. 5
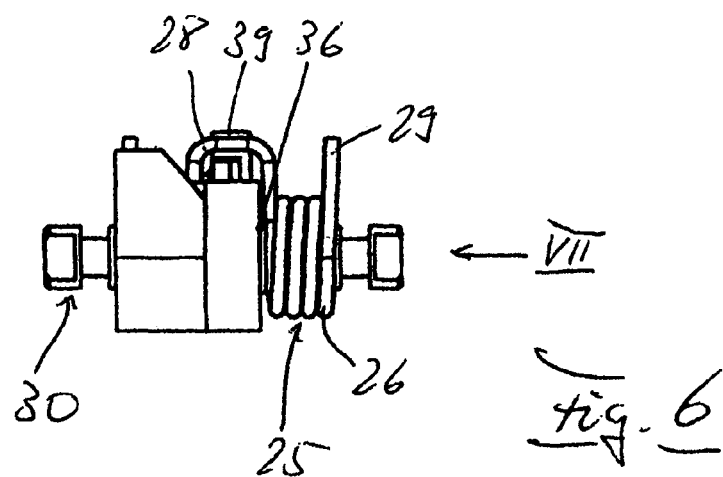
fig. 6
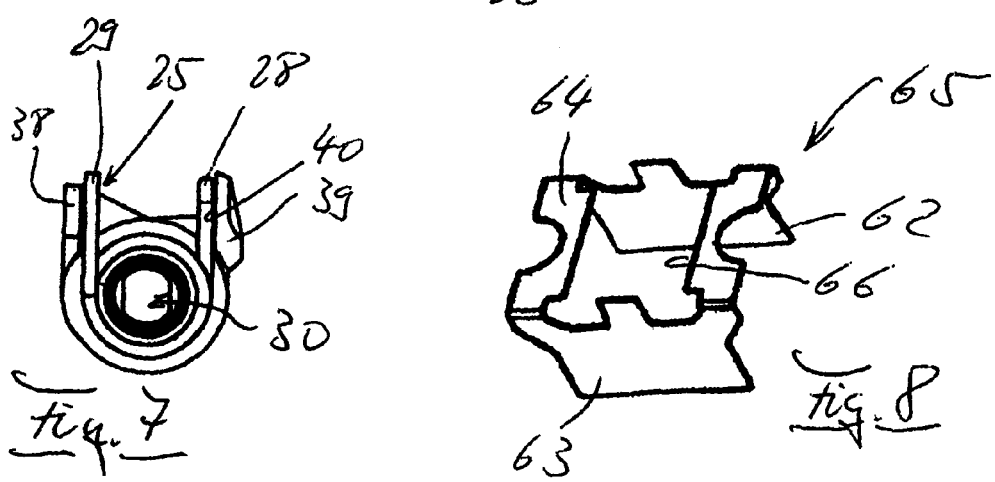
fig. 7
fig. 8

ROCKER SWITCH

RELATED APPLICATION AND CLAIM OF PRIORITY

This application claims the priority benefit of PCT Application No. EP2009/005108 filed Jul. 14, 2009, claiming priority to Germany Patent Application DE 10 2008 033 738.2 filed Jul. 15, 2008. The contents of both applications are each hereby incorporated by reference in their entirety.

BACKGROUND

The present invention relates to a rocker switch in accordance with the preamble to claim 1.

In a rocker switch of the such as that shown in German Patent No. DE 101 17 597 C1, the free spring end shanks, on the one hand, and the extended central spring leg, on the other hand, of the spring that is double wound in the opposite direction are arranged with respect to each other relative to the longitudinal extension of the rotating axel in such a way that between them an obtuse angle is formed within a range of 120° to 180°, in the installed state. Based on the resulting directions of the forces impinging on the spring end shanks and on the central spring leg during deflection, the resulting force causes the wound spring areas to rub against the underside of the rotating axle. The consequence is an imprecise center position for each return motion. In addition, the hysteresis curve (force F as a function of actuation angle α) is, first of all, very broad and, second, different for the two spring end shanks.

Therefore, it is the objective of the present invention to provide a rocker switch of the aforementioned type whose center position can be adjusted mechanically in a more concise and exact manner.

SUMMARY

This disclosure is not limited to the particular systems, devices and methods described, as these may vary. The terminology used in the description is for the purpose of describing the particular versions or embodiments only, and is not intended to limit the scope.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this document is to be construed as an admission that the embodiments described in this document are not entitled to antedate such disclosure by virtue of prior invention. As used in this document, the term "comprising" means "including, but not limited to."

To achieve a rocker switch of the aforementioned type whose center position can be adjusted mechanically in a more concise and exact manner, the features indicated in claim 1 are provided.

As a result of the measures according to the invention, the individual spring parts of the spring that is double wound in the opposite direction can no longer rub against the rotating axle due to the contact surface that is parallel and opposite to the spring forces during deflection, because the resulting spring force is directed away from the lower side of the rotating axle. As a result, the center position in response to each return motion can be mechanically adjusted more precisely and autonomously, which also has the advantage that the center window that is electrically placed over it can be more precisely calibrated and the system can operate with greater sensitivity. In addition, eliminating the friction component also has the advantage that in response to actuation there is a more precise resolution between center position and external pressure point or detent. The hysteresis loop, or curve, is very narrow and is the same for both spring end shanks.

In another advantageous embodiment, the features in accordance with claim 2 are provided, which results in the advantage that the deflection force in both directions of motion is identical, so that an imbalance in the spring prestressing is avoided.

In another embodiment of the invention, the features in accordance claim 3 are provided, which results in an additional fixing of the spring with respect to the rotating axle. In this context, the features in accordance with claim 4 can be provided.

A robust rotating axle emerges from the features in accordance with claim 5. In this context, it is expedient to provide the features in accordance with claim 6 and/or 7, which results in design simplicity for the position of the spring legs in question. An advantageous mounting pairing with a longer service life of the rotating axle is achieved by the features in accordance with claim 8.

The features in accordance with claim 9 yield a preferred arrangement of the sensors. As a result, the electrical signal analysis, which is triggered by the annular magnet, is improved because the identical magnetic field lines flow through both sensors. The lower sensor receives only a somewhat weaker magnetic flux. The system made up of annular magnet and sensor arrangement is more stable in the face of disruptions in the magnetic flux.

An advantageous fixing of the annular magnet is generated in accordance with the features of claim 10.

The features in accordance with claim 11 yield an advantageous screening of the sensor arrangement from the fluxes of permanent magnets of adjoining rocker switches, so that they are then arranged in series. The electronics on the circuit board are protected to the greatest possible extent from lateral magnetic fields. One preferred embodiment of the screening emerges from the features according to claim 12.

An advantageous embodiment of a seal against humidity is produced by the features in accordance with claim 13. This yields special design and manufacturing advantages with respect to the separate seal provided heretofore, for example in the form of a sealing mat. In another embodiment, in order to expand the sealing concept, the features according to claim 14 are provided, so that two sealing systems that are independent of each other are achieved in combination.

BRIEF DESCRIPTION OF THE DRAWINGS

Further details of the invention may be derived from the following description, in which the invention is described and explained in greater detail on the basis of the exemplary embodiment that is depicted in the drawing. In the drawings:

FIG. 5 depicts a cutaway view along line V of FIG. 4 through the rotating;

FIG. 6 depicts a view in accordance with Arrow VI of FIG. 4, but in the assembled state of the rotating axle;

FIG. 7 depicts a view in accordance with Arrow VII of FIG. 6; and

FIG. 8 depicts a screen plate that is used in the lower housing part in a schematic, representation.

DETAILED DESCRIPTION

Figure 1:
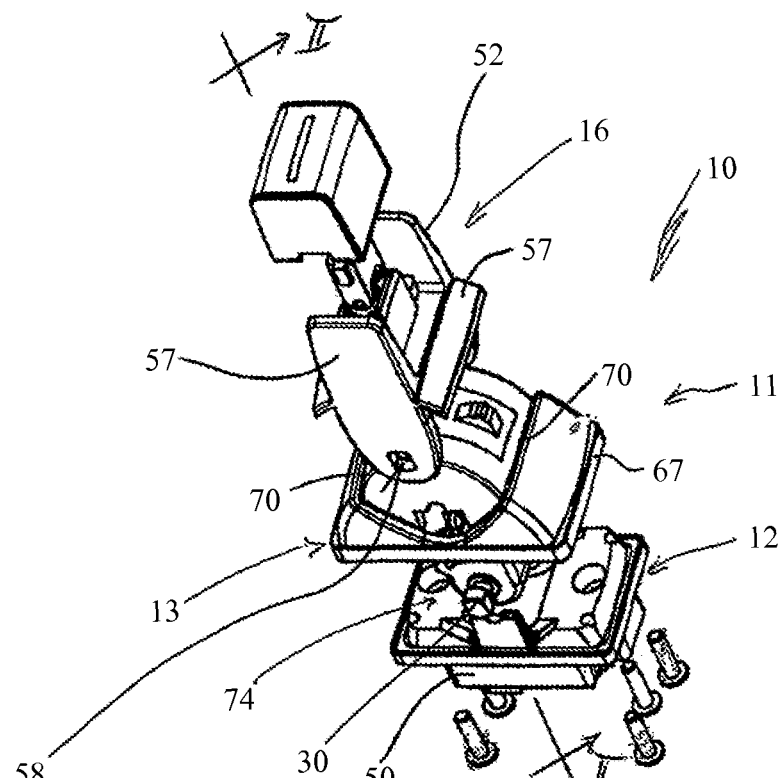
FIG. 1 depicts a rocker switch in an exploded, schematic, perspective representation in accordance with one preferred exemplary embodiment of the present invention.
Figure 3:
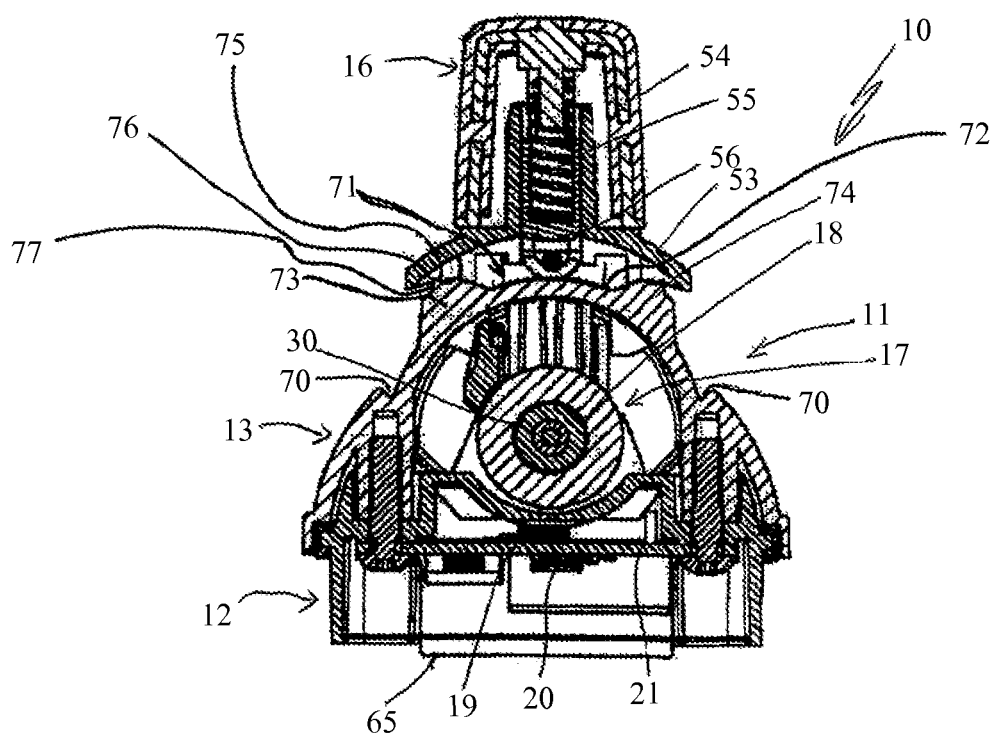
FIG. 3 depicts a cutaway view along the line III-III of FIG. 2.
Figure 2:
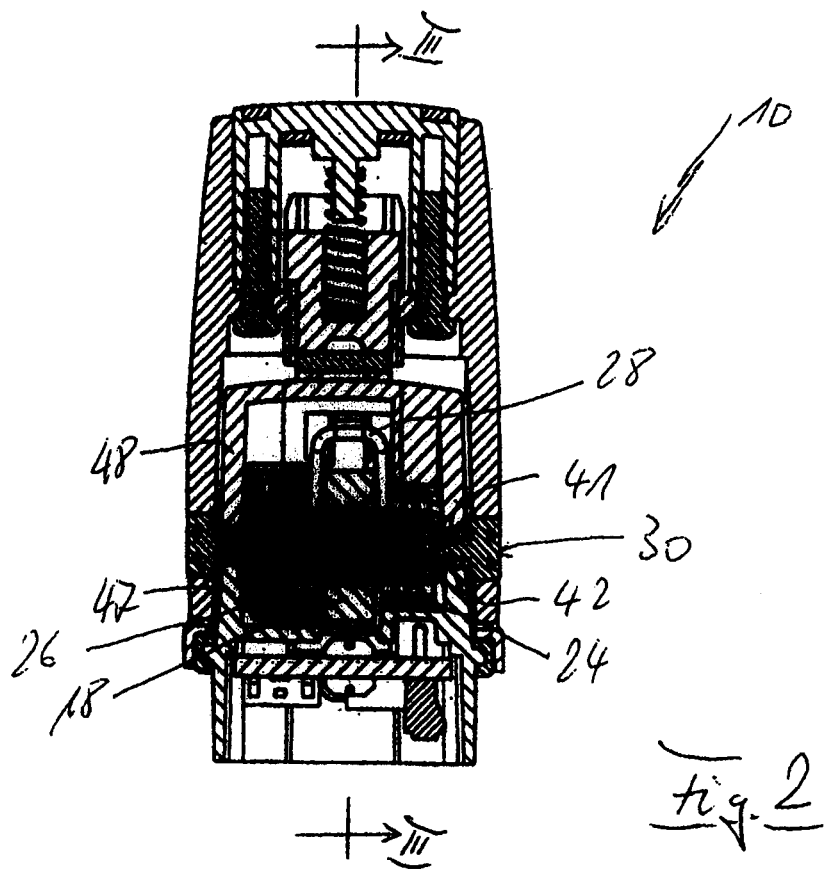
FIG. 2 depicts a cutaway view along the line II-II of FIG. 1, but in the assembled state of the rocker switch.
Figure 4:
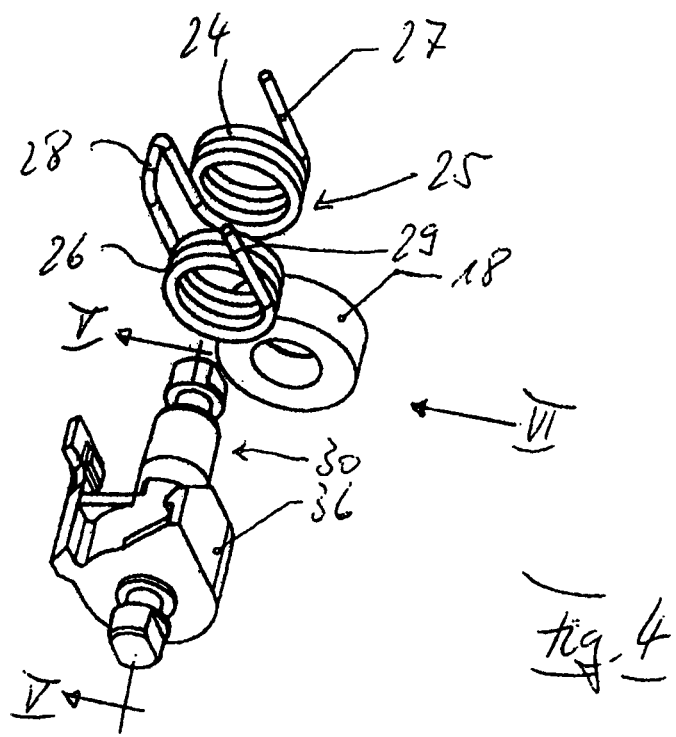
FIG. 4 depicts the switching element of the rocker switch in an exploded, perspective representation.

Rocker switch 10, which is depicted in FIGS. 1 to 3, has a switch housing 11 that is longitudinally rectangular and that is made up of a lower housing part 12 that is open on the upper side and an upper housing part 13, a movable switching element 14 that can be installed in housing 11 and that is made of plastic, an actuating rocker 16 that can be locked so as to transmit motion from outside beyond housing cover 13 using switching element 14, and, besides the aforementioned mechanical switching unit, an electrical, contactless switching unit 17, whose first part 18 is supported on movable switching element 14 and whose second part 19 is supported on a printed circuit board 21, which is advantageously mounted in a detachable manner on the lower side of lower housing part 12 of switching housing 11.

According to FIGS. 4 to 7, rotating axis 30, made of plastic, is formed in one piece, said plastic piece axially and centrally having a hollow metal shaft 31, which through circumferential boreholes is filled with the plastic of rotating axle 30 in the hollow space as well. Both free plastic ends of rotating axle 30, which protrude from switch housing 11, are provided with wrench flats 33. Adjacent to wrench flats 33, rotating axle 30 has a cylindrical bearing region 34 that is formed from a locally exposed metal shaft 31 and that is accommodated and supported in a rotatable manner between two half-shell-like recesses 42 and 41, opposite each other, of lower housing part 12 and upper housing cover 13. A larger-diameter holding piece 35, with a slightly conical shape on the exterior circumferential side, extends between two cylindrical bearing regions 34 and is rotationally fixed along with them. On one longitudinal area of holding piece 35 bordering bearing region 34, to which the exterior circumferential cone rises, holding piece 35 is surrounded by a pot-shaped lug 36, which is put in position in one piece, whose exterior surface is cylindrical, and whose interior surface 37 extends from the interior to the exterior in a conically expanding fashion. The base of lug 36 is formed integrally with holding piece 35. On one circumferential area of pot-shaped lug 36, a contact bar 38 is provided that extends the open side in the axial direction and protrudes tangentially beyond the exterior circumference, and on one area of pot-shaped lug 36, which is opposite the direction of the rotating axle and whose base is opposite, a second contact bar 39 is arranged so as to protrude tangentially beyond the exterior circumferential area, whereby an axially running slot 40 is provided in the sleeve of pot-shaped lug 36 next to contact bar 39. Both contact bars 38 and 39 therefore are tangential with respect to rotating axle 30 and are parallel to each other, although in the axial direction they are at a distance from each other.

A spiral coiled spring 25 that is double wound in the opposite direction is slid over conically increasing holding piece 35 of rotating axle 30, and its spring parts 24 and 26 are arranged at a distance from each other and are connected to each other by a U-shaped bent central leg 28. Each spring part 24, 26 has a free end shank 27, 29, respectively. When spiral coiled spring 25 is slid over holding piece 35 of the rotating axle from the end that is facing away from lug 36 and into pot-shaped lug 36, central leg 28 and end shank 27 of extended spring part 24, with this spring part 24 in a prestressed state, are brought into contact with two contact bars 38 and 39 of lug 36, respectively. In this way, central leg 28 and end shank 27 of prestressed spring part 24 run parallel and opposite to each other, as can be seen from FIG. 7, by way of example.

Lower housing part 12, which is open on the top, has a fixed contact seat in the area of a transverse side and a fixed contact lug on its other transverse side. Running perpendicular to both transverse sides are longitudinal sides 47 and 48, which are provided with lower half-shell-shaped recesses 41.

Rotating axle 30, which is provided with spiral coiled spring 25, is inserted into lower housing part 12 in such a way that, on the one hand, bearing regions 34 lie in half-shell-shaped recesses 41 of lower housing part 12 and, on the other hand, middle leg 28 with its area adjoining contact bar 38 makes contact on fixed contact seat in the upright resting position, and end shank 29 of spring part 26 of spiral coiled spring 25 rests, with prestressing, on slot-shaped contact lug of lower housing part 12. The prestressing of correspondingly shaped spiral coiled spring 25 is achieved and maintained as a result of the fact that end shank 29 of spring part 26 is also placed and fixed in an upright position, in other words parallel to other end shank 27 and to central leg 28.

Rocker switch 10, and its electrical switching unit 17, has an annular permanent magnet 18, which is placed between both spring parts 24 and 26 of spiral coiled spring 25 and is slid along with the spring onto conical holding piece 35 of rotating axle 30. Annular magnet 18, which in the assembled state is magnetized diametrically, is joined to axle 30, and to its holding piece 35, in a rotationally fixed manner, for example using an adhesive. It is also possible to bond annular magnet 18 to the end face of lug 36 so as to create a rotationally fixed connection. In addition, electrical switching unit 17, in the exemplary embodiment, has two Hall sensors 19 and 20, which are arranged opposite each other and which are mechanically and electrically attached to circuit board 21 by their connecting legs. In other words, one Hall sensor 19 is disposed on the side of the circuit board that is facing lower housing part 12, whereas the other Hall sensor 20 is located on the opposite surface of the circuit board. Circuit board 21 in an undepicted manner connects other electrical and electronic components electrically and supports them mechanically. The aforementioned electrical and electronic components, along with the Hall sensor, are arranged on the side of circuit board 21 that is facing away from lower housing part 12. Circuit board 21, which is mounted with components in this manner, is fixedly joined to base 50 of lower housing part 12, preferably using bolts, whereby first Hall sensor 19 is partially accommodated in its thickness in a recess 52 in base 50. The bolts for attaching the circuit board to the lower housing part also serve to join lower housing part 12 to upper housing part 13. The position of both Hall sensors 19 in 20 on circuit board 21 is in accordance with FIGS. 2 and 3 so that they are situated immediately beneath annular magnet 18.

Circuit board 21 is located within a frame part 61, which protrudes from the lower side of base 50 of lower housing part 12 and whose longitudinal sidewalls on the interior side are covered with side parts 62 and 63 of a screen plate 65. Screen plate 65 is configured in accordance with FIG. 9 as a U-shaped grooved part, whose base 64, which forms both sidewalls 62 and 63 and which is located between circuit board 21 and base 50 of lower housing part 12, is provided with a recess 66.

Actuating rocker 16 has a design that is rectangular when it is seen in a side view and in a top view, whereby both sidewalls 51 and 52 are joined to each other in the middle by an intermediate base 53. The upper free end area of sidewalls 51 and 52 is covered by a cap 54, in which a lobe 56 that is acted upon by a pressure spring 55 can be moved back and forth in the direction of arrow R. Lobe 56 is pushed against intermediate base 53 by pressure spring 55, which is in contact with fixed cap 54. Lobe 56 is formed by a pin that is arranged transverse to the direction of motion R. The lower free ends of both sidewalls 51 and 52 are provided with wrench openings 58, which lock in a rotationally fixed manner via an individual wrench flat 33 on the free ends of rotating axle 30.

According to FIG. 3, upper housing cover 13 on its upper, circular jacket surface 71, is configured as a sliding track. For this purpose, jacket surface 71 at two areas that are at an angle to each other has lobes 73 and 74, which in the exemplary embodiment have the same angular distance from a central plane that runs through rocker switch 10. In the exemplary embodiment, the angular distance of the crown of lobes 73 and 74 is 36° from the central plane. In the exemplary embodiment, lobes 73 and 74 are identical; in other words, in the direction of motion A proceeding from the central plane they each have a rising-slope contact chamfer 75, a crown 76 that is connected thereto, and a falling-slope chamfer 77. Falling-slope chamfer 77 in this context can be provided with a locking recess. Of course, it is also possible to provide jacket surface 71 with only one single lobe 73 or 74.

Therefore, actuating rocker 16 may be moved from its resting position in the central plane to the left and/or to the right in the direction of double arrow A, whereby when diagonal pin 56 runs up rising-slope chamfer 75, a first palpable pressure point is achieved, and after achieving the height and prior to the beginning of crown 76 a locking begins that, after traversing crown 76 in locking recess, ends in the area of crown 76 that is facing away in the direction of motion. Actuating rocker 16 is held in this final locking position. From this locking recess, actuating rocker 16 may be unlocked by active pressure being applied in the opposite direction, so that actuating rocker 16 after the return via crown 76 is returned by itself to its idle position by pressure spring 55. The area of sliding track 72 between lobes 73 and 74 is planar in the exemplary embodiment over the circular path. The essential drive for the return of actuating rocker 16 is generated by spiral coil spring 25, which is subjected to a prestressing that is further increased in the direction of motion. The maximum end position of actuating rocker 16 is formed by an edge 70 of upper housing cover 13 that protrudes from jacket surface 71 in the direction of rotating axle 30.

Actuating rocker 16 has roof-like bars 57 that emerge in the direction of motion from both sidewalls 51 and 52 and that in the original idle position of actuating rocker 16 cover lobes 73 and 74 in a freely movable way.

The connection between lower housing part 12 and upper housing cover 13 is provided by various sealing edges. Upper housing cover 13 on its base has a circumferential frame, into which the base of lower housing part 12 is introduced, whereby sealing bars are formed that are triangular in cross section and that run around the periphery of the base along the circumferential edge both towards the frame of upper housing cover 13 and toward the side of frame part 61. Therefore, not only is a seal provided between upper and lower housing part 13, 12, but also a seal of lower housing part 12 with respect to an undepicted carrier plate, which can support multiple rocker switches 10 that are disposed next to each other. A further seal that is formed on the plastic housing can be provided on the free end of a wall part of lower housing part 12, which is connected to a corresponding wall part of upper housing cover 13 so as to be one on top of the other.

If in the depicted exemplary embodiment the deflection of actuating rocker 16 occurs in a range of +/−40°, it is obvious that when the relevant edge area of upper housing cover 13 changes, a greater deflection angle of up to +/−80° may be achieved. Accordingly, upper housing cover 13 on its jacket surface 71 can be provided with further lobes.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

The invention claimed is:

1. A rocker switch having a mechanical switching unit comprising:
    a switch housing;
    a spring-action switching element supported within the switch housing and configured to move back and forth and having an actuating rocker that is connected to the switching element, the switching element comprising a rotating axle rotatably supported within the switch housing and is surrounded by a spring, which is double wound and oppositely coiled and is held in a prestressed state within the switch housing, the spring comprising:
        a first spring part having a free spring end shank being supported in a rotationally fixed manner within the switch housing,
        a second spring part having a free spring end shank being supported on a first arm that is connected in a rotationally fixed manner to the rotating axle, and
        an extended, U-shaped central spring leg being both fixedly supported within the switch housing and supported on a second arm that is connected in a rotationally fixed manner to the rotating axle; and
    an electrical switching unit,
    wherein the two free spring end shanks and the extended, U-shaped central spring leg in the installed state are arranged so that the extended, U-shaped central spring leg defines a first plane and the two free spring end shanks define a second plane, wherein the first plane and the second plane run substantially parallel to each other and oppose each other with respect to the longitudinal extension of the rotating axle.

2. The rocker switch as recited in claim 1, wherein the first and second spring parts of the spring that are wound in opposite directions have the same number of windings.

3. The rocker switch as recited in claim 2, wherein the spring end shank of the first spring part connected in a rotationally fixed manner to the rotating axle is fixedly accommodated on the external circumferential side in a roughly pot-shaped concentric lug that has an axial slot in a circumferential area.

4. The rocker switch as recited in claim 3, wherein the lug has a tangential contact surface that on an exterior side borders the axial slot for the spring end shank of the first spring part.

5. The rocker switch as recited in claim 3, wherein the rotating axle comprises a metal tube, a plastic-coated interior side, and a plastic-coated exterior side.

6. The rocker switch as recited in claim 5, wherein the lug is a part of the plastic-coated exterior side of the rotating axle.

7. The rocker switch as recited in one or more of claim 6, wherein the lug on a circumferential area has an axial and tangentially oriented extension, which forms the contact surface for the prestressed central spring leg.

8. The rocker switch as recited in claim 6, wherein an external circumferential side of the metal tube is supported within the switch housing.

9. The rocker switch as recited in claim 1, wherein the electrical switching unit has a permanently magnetized annular magnet that moves along with the rotating axle and wherein two sensors are assigned to the annular magnet and are arranged so as to be opposite each other on the upper and lower side of a circuit board beneath a housing base.

10. The rocker switch as recited in claim 9, wherein the annular magnet is rotationally fixed on the rotating axle or on the lug.

11. The rocker switch as recited in claim 9, in which the switch housing has a lower and upper housing part, wherein the lower housing part has a frame that protrudes perpendicularly from the lower side of its base, within which the circuit board is arranged so as to be attached to the base, and wherein a screen plate is at least partially arranged within the frame and between the circuit board and the base.

12. The rocker switch as recited in claim 11, wherein the screen plate is coated with plastic.

13. The rocker switch of claim 2, wherein the number of windings is three.

14. The rocker switch as recited in claim 10, wherein the annular magnet is rotationally fixed on the rotating axle or on the lug using an adhesive.

* * * * *